(12) United States Patent
Lena et al.

(10) Patent No.: US 8,671,630 B2
(45) Date of Patent: Mar. 18, 2014

(54) PHOTOVOLTAIC ROOF COVERING

(75) Inventors: Grégoire François Lena, Meudon (FR); Wayne E. Shaw, Glen Mills, PA (US); Gregory F. Jacobs, Oreland, PA (US)

(73) Assignee: CertainTeed Corporation, Valley Forge, PA (US)

( * ) Notice: Subject to any disclaimer, the term of this patent is extended or adjusted under 35 U.S.C. 154(b) by 460 days.

(21) Appl. No.: 12/594,925

(22) PCT Filed: Apr. 4, 2008

(86) PCT No.: PCT/FR2008/050608
§ 371 (c)(1),
(2), (4) Date: Mar. 18, 2010

(87) PCT Pub. No.: WO2008/139102
PCT Pub. Date: Nov. 20, 2008

(65) Prior Publication Data
US 2010/0180523 A1 Jul. 22, 2010

Related U.S. Application Data

(60) Provisional application No. 60/940,551, filed on May 29, 2007.

(30) Foreign Application Priority Data

Apr. 6, 2007 (FR) ...................... 07 54384

(51) Int. Cl.
*E04D 13/18* (2006.01)
*E04D 1/10* (2006.01)
*E04C 2/38* (2006.01)
*H01L 31/048* (2006.01)
*H01L 31/02* (2006.01)
*H01L 31/05* (2006.01)

(52) U.S. Cl.
USPC ........................ 52/173.3; 136/244; 136/251

(58) Field of Classification Search
USPC .............. 52/173.3, 748.1, 409; 136/243, 244, 136/251
See application file for complete search history.

(56) References Cited

U.S. PATENT DOCUMENTS 4,040,867 A 8/1977 Forestieri et al.
4,190,038 A * 2/1980 Heitland et al. .............. 126/673
(Continued)

FOREIGN PATENT DOCUMENTS

CA 2683308 A1 * 11/2008
DE 296 09 816 U1 8/1996
(Continued)

OTHER PUBLICATIONS

English Translation of International Preliminary Report on Patentability Chapter I (IB/373) for International Application No. PCT/FR2008/050608 dated Dec. 7, 2009 (8 pages).*

*Primary Examiner* — Basil Katcheves
*Assistant Examiner* — Rodney Mintz
(74) *Attorney, Agent, or Firm* — McDonnell Boehnen Hulbert & Berghoff LLP

(57) ABSTRACT

In certain aspects, the present invention relates to a photovoltaic roof covering in the form of overlapping elements (i.e., tiles, shingles or panels), electrically connected to one another. Each of the elements includes a backing material and a photovoltaic layer arranged at least over that portion of the exterior face of the backing material that is exposed to the outside. Electrical conductors are positioned on each side of said photovoltaic layer and are configured to collect the electrical current generated by said layer when it is exposed to light. Notably, at least one of the connectors includes or is incorporated into a foldable moving tongue or strip and in that said tongue or said strip is kept in electrical contact with a connector of an underlying element and in a position that is folded over between the element and the underlying element.

11 Claims, 8 Drawing Sheets

(56) References Cited

U.S. PATENT DOCUMENTS

| | | | |
|---|---|---|---|
| 4,310,211 A * | 1/1982 | Bunnell et al. | 439/358 |
| 4,457,578 A * | 7/1984 | Taylor | 439/801 |
| 5,232,518 A * | 8/1993 | Nath et al. | 136/251 |
| 5,338,369 A * | 8/1994 | Rawlings | 136/246 |
| 5,409,549 A * | 4/1995 | Mori | 136/244 |
| 5,437,735 A * | 8/1995 | Younan et al. | 136/251 |
| 5,505,788 A * | 4/1996 | Dinwoodie | 136/246 |
| 5,575,861 A * | 11/1996 | Younan et al. | 136/251 |
| 5,590,495 A * | 1/1997 | Bressler et al. | 52/173.3 |
| 5,651,837 A * | 7/1997 | Ohtsuka et al. | 136/251 |
| 5,741,370 A * | 4/1998 | Hanoka | 136/251 |
| 5,986,203 A * | 11/1999 | Hanoka et al. | 136/251 |
| 5,990,414 A * | 11/1999 | Posnansky | 136/244 |
| 6,148,570 A * | 11/2000 | Dinwoodie et al. | 52/173.3 |
| 6,155,006 A * | 12/2000 | Mimura et al. | 52/173.3 |
| 6,232,544 B1 * | 5/2001 | Takabayashi | 136/244 |
| 6,311,436 B1 * | 11/2001 | Mimura et al. | 52/173.3 |
| 6,323,478 B1 * | 11/2001 | Fujisaki et al. | 250/214 SG |
| 6,336,304 B1 * | 1/2002 | Mimura et al. | 52/748.1 |
| 6,552,258 B2 * | 4/2003 | Kinoshita et al. | 136/251 |
| 6,553,729 B1 * | 4/2003 | Nath et al. | 52/173.3 |
| 6,570,084 B2 * | 5/2003 | Dinwoodie | 136/251 |
| 6,606,830 B2 * | 8/2003 | Nagao et al. | 52/173.3 |
| 6,883,290 B2 * | 4/2005 | Dinwoodie | 52/748.1 |
| 6,928,775 B2 * | 8/2005 | Banister | 52/173.3 |
| 7,138,578 B2 * | 11/2006 | Komamine | 136/251 |
| 7,178,295 B2 * | 2/2007 | Dinwoodie | 52/173.3 |
| 7,328,534 B2 * | 2/2008 | Dinwoodie | 52/173.3 |
| 7,387,537 B1 * | 6/2008 | Daily et al. | 439/620.22 |
| 7,445,508 B2 * | 11/2008 | Daily et al. | 439/620.22 |
| 7,578,102 B2 * | 8/2009 | Banister | 52/173.3 |
| 7,587,864 B2 * | 9/2009 | McCaskill et al. | 52/173.3 |
| 7,632,109 B2 * | 12/2009 | Boensch et al. | 439/76.1 |
| 7,648,371 B2 * | 1/2010 | Boensch et al. | 439/76.1 |
| 7,678,990 B2 * | 3/2010 | McCaskill et al. | 136/244 |
| 7,678,991 B2 * | 3/2010 | McCaskill et al. | 136/244 |
| 7,681,363 B2 * | 3/2010 | Banister | 52/173.3 |
| 7,713,089 B2 * | 5/2010 | Faust et al. | 439/620.21 |
| 7,824,190 B2 * | 11/2010 | Beck et al. | 439/76.1 |
| 7,832,176 B2 * | 11/2010 | McCaskill et al. | 52/748.1 |
| 7,845,141 B2 * | 12/2010 | Martinique | 52/748.1 |
| 7,854,095 B2 * | 12/2010 | Banister | 52/748.1 |
| 7,971,398 B2 * | 7/2011 | Tweedie | 52/173.3 |
| 8,136,310 B2 * | 3/2012 | Tweedie | 52/173.3 |
| 8,163,125 B2 * | 4/2012 | Keenihan et al. | 156/245 |
| 8,168,880 B2 * | 5/2012 | Jacobs et al. | 136/244 |
| 8,205,400 B2 * | 6/2012 | Allen | 52/173.3 |
| 8,209,920 B2 * | 7/2012 | Krause et al. | 52/173.3 |
| 8,234,821 B2 * | 8/2012 | Plaisted et al. | 52/58 |
| 8,256,170 B2 * | 9/2012 | Plaisted et al. | 52/173.3 |
| 8,377,358 B2 * | 2/2013 | Keenihan et al. | 264/275 |
| 8,409,906 B2 * | 4/2013 | Guo et al. | 438/72 |
| 8,450,595 B2 * | 5/2013 | Harada et al. | 136/243 |
| 8,507,784 B2 * | 8/2013 | White | 136/244 |
| 8,511,006 B2 * | 8/2013 | Reisdorf et al. | 52/173.3 |
| 2001/0034982 A1 | 11/2001 | Nagao et al. | 52/173.3 |
| 2001/0050102 A1 * | 12/2001 | Matsumi et al. | 136/244 |
| 2002/0038530 A1 * | 4/2002 | Clark | 52/171.3 |
| 2002/0134421 A1 * | 9/2002 | Nagao et al. | 136/244 |
| 2003/0010372 A1 * | 1/2003 | Dinwoodie | 136/244 |
| 2003/0154666 A1 * | 8/2003 | Dinwoodie | 52/173.3 |
| 2003/0154667 A1 * | 8/2003 | Dinwoodie | 52/173.3 |
| 2003/0224506 A1 * | 12/2003 | Agrawal et al. | 435/287.2 |
| 2004/0000334 A1 * | 1/2004 | Ressler | 136/251 |
| 2004/0187434 A1 * | 9/2004 | Podirsky | 52/748.1 |
| 2005/0076948 A1 * | 4/2005 | Komamine | 136/251 |
| 2005/0178429 A1 | 8/2005 | McCaskill et al. | |
| 2005/0210825 A1 * | 9/2005 | Peleg | 52/748.1 |
| 2005/0279400 A1 * | 12/2005 | Banister | 136/244 |
| 2006/0029775 A1 * | 2/2006 | MacKinnon et al. | 428/141 |
| 2006/0032527 A1 * | 2/2006 | Stevens et al. | 136/251 |
| 2006/0196128 A1 * | 9/2006 | Duke | 52/173.3 |
| 2006/0266405 A1 * | 11/2006 | Lenox | 136/244 |
| 2007/0227583 A1 * | 10/2007 | Davies et al. | 136/251 |
| 2008/0302031 A1 * | 12/2008 | Bressler et al. | 52/173.3 |
| 2008/0302408 A1 * | 12/2008 | Bressler et al. | 136/251 |
| 2008/0302409 A1 * | 12/2008 | Bressler et al. | 136/251 |
| 2008/0313976 A1 * | 12/2008 | Allen | 52/173.1 |
| 2008/0313977 A1 * | 12/2008 | Banister | 52/173.3 |
| 2008/0314432 A1 * | 12/2008 | Paulson et al. | 136/244 |
| 2009/0000221 A1 * | 1/2009 | Jacobs et al. | 52/173.3 |
| 2009/0000222 A1 * | 1/2009 | Kalkanoglu et al. | 52/173.3 |
| 2009/0159118 A1 * | 6/2009 | Kalkanoglu et al. | 136/251 |
| 2009/0178350 A1 * | 7/2009 | Kalkanoglu et al. | 52/173.3 |
| 2010/0051084 A1 * | 3/2010 | Nocito et al. | 136/244 |
| 2010/0154859 A1 * | 6/2010 | Antaya et al. | 136/244 |
| 2010/0170169 A1 | 7/2010 | Railkar et al. | |
| 2010/0236155 A1 * | 9/2010 | Lanza | 52/58 |
| 2010/0242381 A1 * | 9/2010 | Jenkins | 52/173.3 |
| 2010/0275534 A1 * | 11/2010 | Ruskin et al. | 52/173.3 |
| 2011/0017278 A1 * | 1/2011 | Kalkanoglu et al. | 136/251 |
| 2011/0101564 A1 * | 5/2011 | Keenihan et al. | 264/277 |
| 2011/0132427 A1 * | 6/2011 | Kalkanoglu et al. | 136/244 |
| 2011/0155206 A1 * | 6/2011 | Lee et al. | 136/244 |
| 2011/0155220 A1 * | 6/2011 | Lee et al. | 136/251 |
| 2011/0183540 A1 * | 7/2011 | Keenihan et al. | 439/345 |
| 2011/0197947 A1 * | 8/2011 | Croft | 136/244 |
| 2011/0284052 A1 * | 11/2011 | Croft et al. | 136/244 |
| 2011/0314753 A1 * | 12/2011 | Farmer et al. | 52/173.3 |
| 2012/0118493 A1 * | 5/2012 | Kalkanoglu et al. | 156/245 |
| 2012/0124921 A1 * | 5/2012 | Shiao et al. | 52/173.3 |
| 2012/0137600 A1 * | 6/2012 | Jenkins | 52/173.3 |
| 2012/0137601 A1 * | 6/2012 | Peelman et al. | 52/173.3 |
| 2012/0174505 A1 * | 7/2012 | Jacobs et al. | 52/173.3 |
| 2012/0192509 A1 * | 8/2012 | Chihlas et al. | 52/173.1 |
| 2012/0216467 A1 * | 8/2012 | Kalkanoglu et al. | 52/173.3 |
| 2012/0291837 A1 * | 11/2012 | Lin et al. | 136/244 |
| 2012/0291848 A1 * | 11/2012 | Sherman et al. | 136/246 |
| 2012/0298171 A1 * | 11/2012 | Huang et al. | 136/244 |
| 2013/0032199 A1 * | 2/2013 | Bengtson et al. | 136/251 |
| 2013/0056047 A1 * | 3/2013 | Beck et al. | 136/251 |
| 2013/0098420 A1 * | 4/2013 | Sherman et al. | 136/244 |

FOREIGN PATENT DOCUMENTS

| | | |
|---|---|---|
| DE | 296 19 119 U1 | 1/1998 |
| DE | 100 46 134 A1 | 4/2002 |
| DE | 103 58 851 A1 | 1/2005 |
| JP | 2001-227109 A | 8/2001 |
| JP | 2001248276 A | 9/2001 |
| JP | 2002-170979 A | 6/2002 |
| JP | 2005-123370 A | 5/2005 |
| WO | WO 2007019183 A2 * | 2/2007 |
| WO | 2007/035677 A | 3/2007 |
| WO | 2008073905 A2 | 6/2008 |
| WO | WO 2008139102 A3 * | 4/2009 |
| WO | WO 2009137347 A2 * | 11/2009 |

* cited by examiner

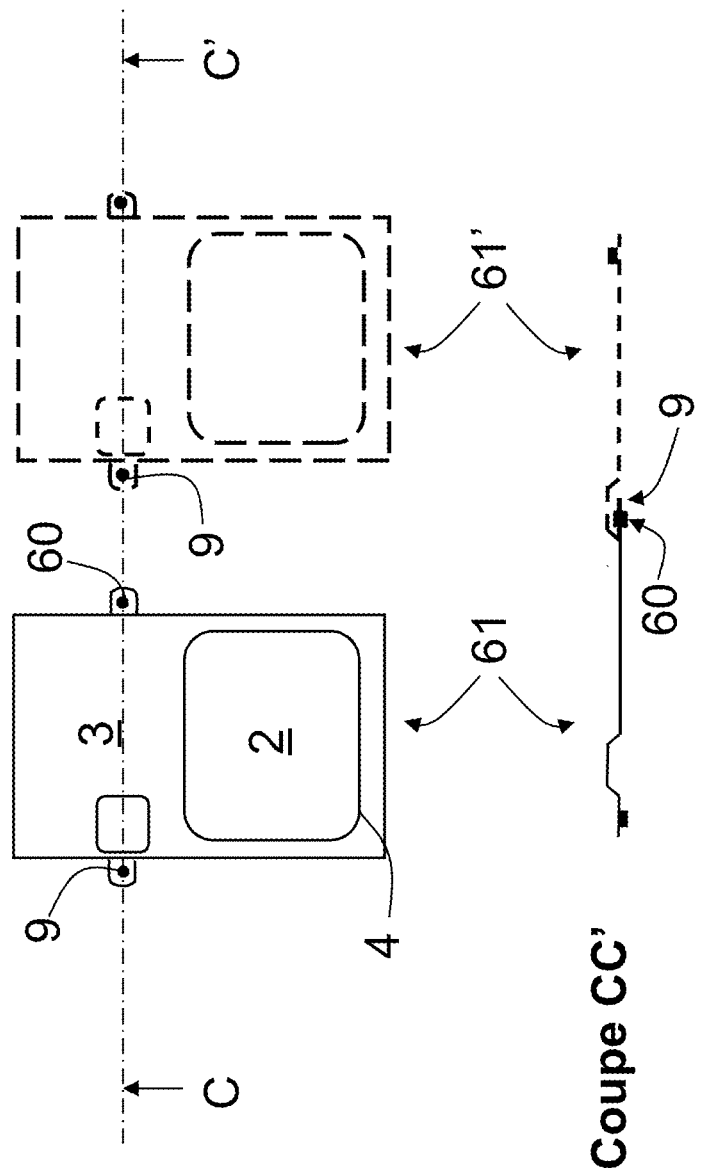

PHOTOVOLTAIC ROOF COVERING

This application is a U.S. national phase of International Application No. PCT/FR2008/050608 filed on Apr. 4, 2008, which claims priority to U.S. Provisional Application No. 60/940,551 filed on May 29, 2007 and French Application No. 0754384 filed on Apr. 6, 2007, the disclosures of which are incorporated herein by reference in their entirety.

The present invention relates to the field of coverings, particularly roof coverings comprising a photovoltaic component for converting solar energy into electrical energy.

Numerous systems have already been described, proposing various solutions for harnessing solar energy, particularly using elements arranged in the roof covering of buildings, private homes or the like. However, even nowadays these are atypical constructions which are too expensive not only in terms of their manufacture but also in terms of their installation which requires qualified installers. Thus, for the most part, they do not correspond to current building formats, particularly the conventional forms of roof covering elements and thus usually have to be installed and adapted specifically to suit the building that is to be covered.

Furthermore, present-day photovoltaic installations, particularly those incorporated directly into the roof structure, are subject to operating conditions which detract from their reliability over time. This lack of reliability is caused mainly by the design and specific installation of the proposed systems as previously described but also by the difficulties there are in connecting the assembled solar modules to the roof structure both at the time of installation and over time, particularly under the effect of inclement weather.

More specifically, there are various designs of tile, shingle or panel which act as roofing and produce solar electricity. These tiles are equipped with photovoltaic cells on their upper face, their underside being laid against the roof. They overlap partially, the regions of overlap creating points of contact in order to provide connection between the photovoltaic cells of one tile and the next in the absence of connecting cables.

In a first example, U.S. Pat. No. 4,040,867 proposes solar tiles which have a region of overlap and a connecting system that provides direct cableless electrical contact from tile to tile. Connection is performed by an element external to the tiles, which is U-shaped and conducting, and straddles the two tiles at the connecting points. This U-shaped element is then immobilized by a protective strip in order to maintain contact between the successive tiles and guard it against external attack. Installing and protecting this contact element is a very precise and fiddly operation. Further, there is a high risk that it will be incorrectly positioned at the time of installation and that the contact will change over time, particularly under the influence of severe weather.

Also known, from U.S. Pat. No. 5,590,495, are tiles, possibly semi-rigid tiles, equipped with a photovoltaic module which are connected together with no connecting cables. These tiles consist of a base layer of backing material partially covered with a photovoltaic film. The photovoltaic film is partially covered by a protective layer of translucent materials.

The cableless connection is provided by bringing that upper part of the photovoltaic film that is not covered by the protective layer of one tile into contact with that lower part of the photovoltaic film that is protected by the layer of translucent material but which is free because it projects beyond the base layer of backing material of a following tile. Busbars connect several rows of tiles from regions that project, left free at the end of each row.

The quality of the contact in this system is, however, somewhat unreliable and seems not to be very durable over time. In order to offset these disadvantages, provision is made for the electrical contacting of the tiles to be associated with mechanical attachment to the roof so as to provide electrical contact between the projecting regions, but this system is still unsatisfactory because there is a high risk that the contact regions will become damaged during the attachment operation.

Furthermore, because the region of electrical contact between the successive elements in this embodiment lies at the periphery of said elements and is not very well protected or is even in direct contact with environmental substances, particularly water, that there may be between two elements, there is a problem of sealing and of durability with respect to the atmospheric conditions, particularly inclement weather, encountered. Finally, this type of embodiment which in fact combines materials of different kinds fixed together at a point introduces stresses because of their difference in expansion according to atmospheric conditions.

Finally, US application 2005/0178429 discloses a flexible adhesive panel equipped with photovoltaic modules that are periodically dispersed and have recesses away from the module regions which house the contacts of the modules of the panel which is positioned over the top. However, these panels are difficult to install, given the high number of connections per panel, and the quality of the contact is somewhat unreliable given the change in adhesive properties over time. What is more, this design assumes that the roofing material has a hole so that the connector can be fed through the solar module, this ultimately leading to problems with sealing.

It is therefore an object of the present invention to solve the problems of the prior art as set out hereinabove and a particular object of the present invention is to propose a roof covering using elements that are as simple as possible in design, and therefore inexpensive to manufacture. An element such as this may in particular be produced to the standard shapes of roofing elements, for example in the form of curved or flat tiles sometimes universally known by their English name of "tiles", of slates sometimes universally known by their English name of "slates", of shingles sometimes universally known by their English names of "shakes" or "shingles" or panels sometimes known universally by their English name of "panels". It being possible for these elements to be made of natural or synthetic or metallic materials or combinations of these various shapes or types of material.

The roofing elements according to the invention may be laid on battens and/or on lathwork and/or on a conventional roofing panel that forms a continuous support, often known by its English names of "roof deck" or "roof sheets" in the usual way, that is to say according to the working practices currently employed in the trade.

According to certain embodiments, they may cover the entire surface of the roof or just part thereof. Advantageously, they do not differ appreciably in shape and design from current types of roofing. Furthermore, they do not require any ancillary elements under the roofing layer, particularly they do not require any special supports or wiring. However, it would not constitute a departure from the scope of the present invention if such ancillary elements were provided. The result is that the invention can also be applied to the renovation of existing buildings and to the erection of new buildings. Buildings must be understood to mean buildings for residential use, for commercial use, or for other purposes. More specifically, some elements may ultimately be removed from the roof covering according to the invention and reinstalled, individually or in number, for example in the case of repairs or replacement.

It is another object of the present invention to guarantee the watertightness and sealing of a roof comprising a covering made with elements according to the invention, to the same standards as with normal tiles.

More specifically, the roof covering with a photovoltaic function according to the invention is simple, inexpensive, and allows a reliable and durable connection between solar modules (known as elements or photovoltaic elements in the remainder of the description) of which it is composed, while at the same time guaranteeing satisfactory esthetics. In addition, the roofing properties of the coverings according to the invention are not degraded by comparison with a conventional roof covering that has no photovoltaic function because the addition of this function does not entail piercing the exposed surface of the covering element.

More specifically, the present invention relates to a photovoltaic roof covering comprising a collection of a plurality of elements in the form of tiles, shingles or panels, electrically connected to one another, a part or portion of said elements being covered by the adjacent elements in the collection and another part or portion being exposed to the outside, said elements comprising:

a backing material comprising an interior face and an exterior face, a photovoltaic layer arranged at least over that portion of the part of the exterior face of the backing material that is exposed to the outside in the collection, possibly an electrically insulating layer consisting, for example, of a film, preferably a polymer film, covering said backing material on its exterior and/or interior face, possibly a translucent or transparent protective layer covering at least said photovoltaic layer, electrical conduction means positioned on each side of said photovoltaic layer and configured to collect the electrical current generated by said layer when it is exposed to light, said means in particular comprising a first connector connected to one electrical pole of the photovoltaic layer and a second connector connected to another electrical pole of the photovoltaic layer.

The present covering is also characterized in that at least one of the connectors present on at least one of said elements comprises, consists of, or is incorporated into, a foldable moving tongue or strip and in that said tongue or said strip is kept, in the collection, in electrical contact with a connector of the previous element of said collection and in a position that is folded over between the two successive elements.

Said elements may be mounted in series and/or in parallel, each of the ends of said collection being electrically connected by busbars to a current converter typically used to power a domestic electric installation.

Advantageously, the electrical and mechanical connection between two connectors of two successive elements is performed using fixing means chosen from conductive adhesives, possibly heat-activated ones, cold or hot solder, metallic pads and, more generally, any pressure-sensitive fixing system, the customary mechanical fixing means such as nails, staples, screws or rivets.

According to a possible embodiment, that part of the elements that is exposed to the outside in the collection has an outwardly curved shape.

For example, the electrical and mechanical connection between two successive elements is performed using a device of the press-stud type, the male or female part of the device forming part of a first connector of a first element and the female or male part of the device forming part of the foldable moving tongue or strip of a second element. The male and female parts may be covered with one or more electrically insulating damp-proof films or covers.

According to the invention, the backing material supporting the constituent elements may be rigid and of the clay type, and the tongue or the strip is made of or comprises an identical or different rigid material, the connection and mobility of the tongue being afforded by a fold-over means such as a hinge and/or by a collection of one or more films consisting for example of the electrically insulating layer that at least partially covers said backing material and/or the translucent protective layer that covers at least said photovoltaic layer.

The backing material supporting the elements may also consist of a flexible or semi-rigid material, the deformation of which allows said tongue or said strip to be brought into the folded-over position.

According to one possible embodiment, each element comprises a fixed first connector and a second connector in the form of a foldable moving tongue or strip, said first and second connectors being positioned on each element in such a way that, within the collection:

said foldable moving tongue or strip is in electrical contact with the fixed connector of the previous element in the collection, said tongue or strip being kept in a folded-over position between these two successive elements, said first connector is in electrical contact with the tongue or the strip of the next element in the collection, this tongue or strip being kept in a folded-over position between these two successive elements.

For example, the fixed connector is positioned on that part of said elements that is covered in the collection. According to another example, the fixed connector is a non-removable tongue or strip positioned on one side of the element.

According to another embodiment, a first type of element comprises fixed connectors and a second type of element comprises connectors in the form of a foldable moving tongue or strip, said elements being positioned in the collection in such a way that the fixed connectors of the elements of the first type are in electrical contact with the tongues or strips of an element of the second type, said tongues or strips being kept in a folded-over position between two successive elements.

According to one alternative embodiment, the first type of element comprises two fixed connectors positioned on that part of said elements that is covered in the collection and in which the second type of element comprises two tongues positioned in the continuation of that part of said elements that is exposed to the outside in the collection, in which a first horizontal row of the collection consists of a juxtaposition of elements of the first type and a second, higher, horizontal row of the collection consists of a juxtaposition of elements of the second type, the two rows being staggered relative to one another with an offset equal to half the width of the element.

The present invention further relates to a photovoltaic roofing element as previously described, which can be assembled into collections to produce the roof covering. The roofing element is in the form of tiles, shingles or panels as described previously and is characterized in that it comprises at least one connector comprising, consisting of or incorporated into a removable tongue or strip. This tongue or strip is positioned according to the invention in such a way as to allow connection to some other, identical or different, element in the collection.

The exemplary embodiments which follow are given purely by way of illustration and should not be considered to restrict the scope of the present invention in any of the aspects described.

Figure 3:
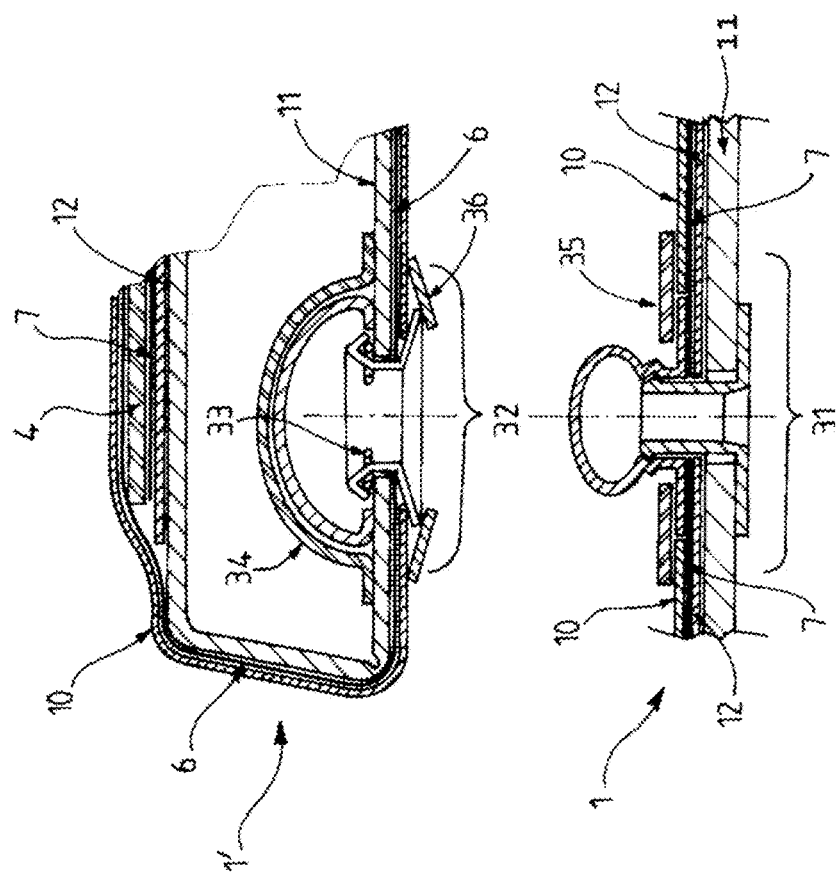

FIG. 3 schematically shows one particular embodiment of the electrical connection between two elements of the covering.

Figure 4:
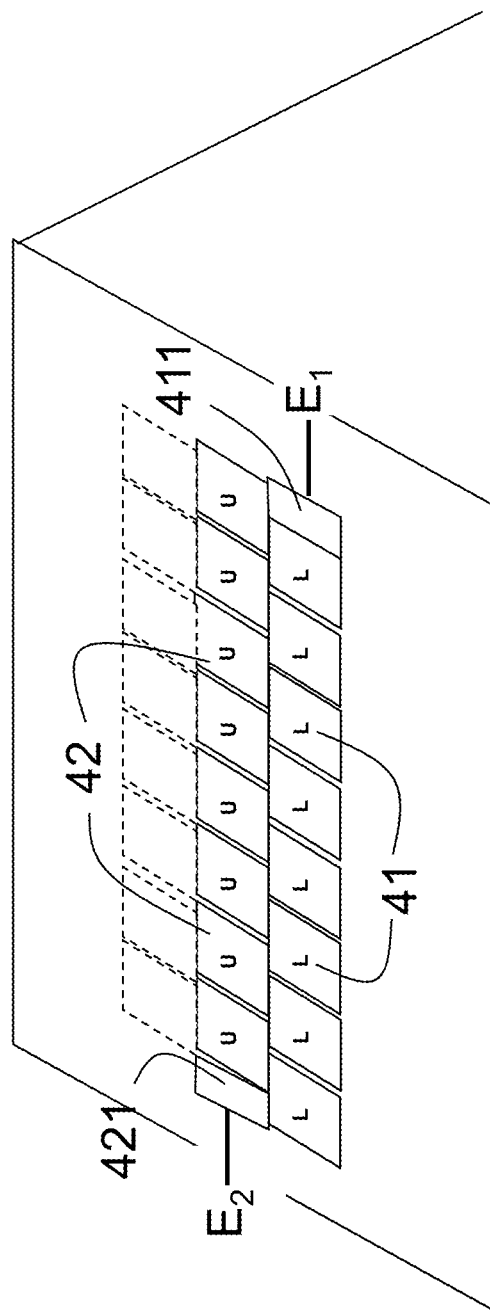

FIG. 4 illustrates a roof equipped with elements according to a second embodiment of the invention.

Figure 5:
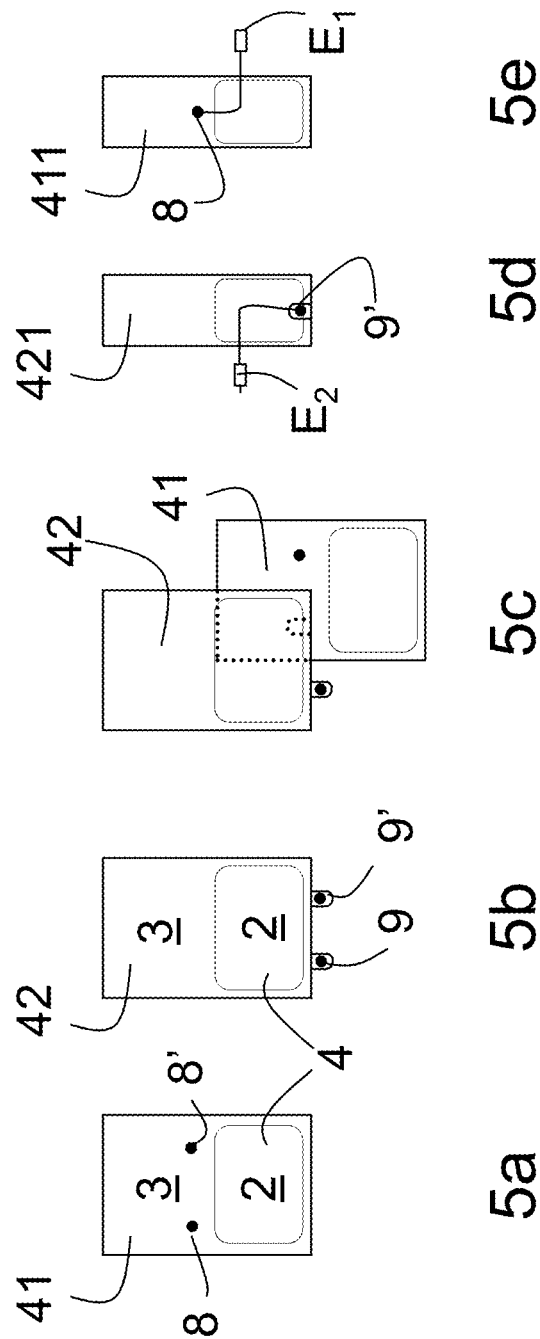

FIG. 5 illustrates the detail of the structure and arrangement of the elements that make up the roof of FIG. 4.

Figure 6:
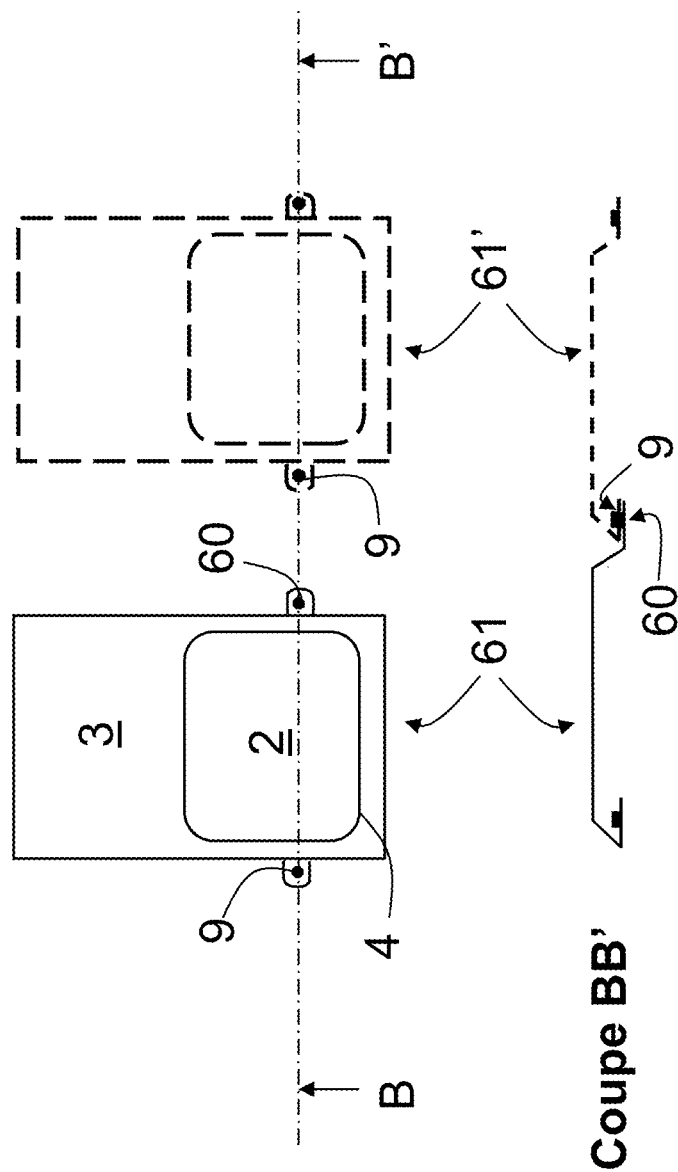

FIGS. 6 and 7 respectively illustrate other embodiments of a covering element according to the invention and how such elements are assembled.

In all the figures of the present description, elements of the same kind or which are identical from one figure to another are denoted by the same reference numerals.

Figure 1:
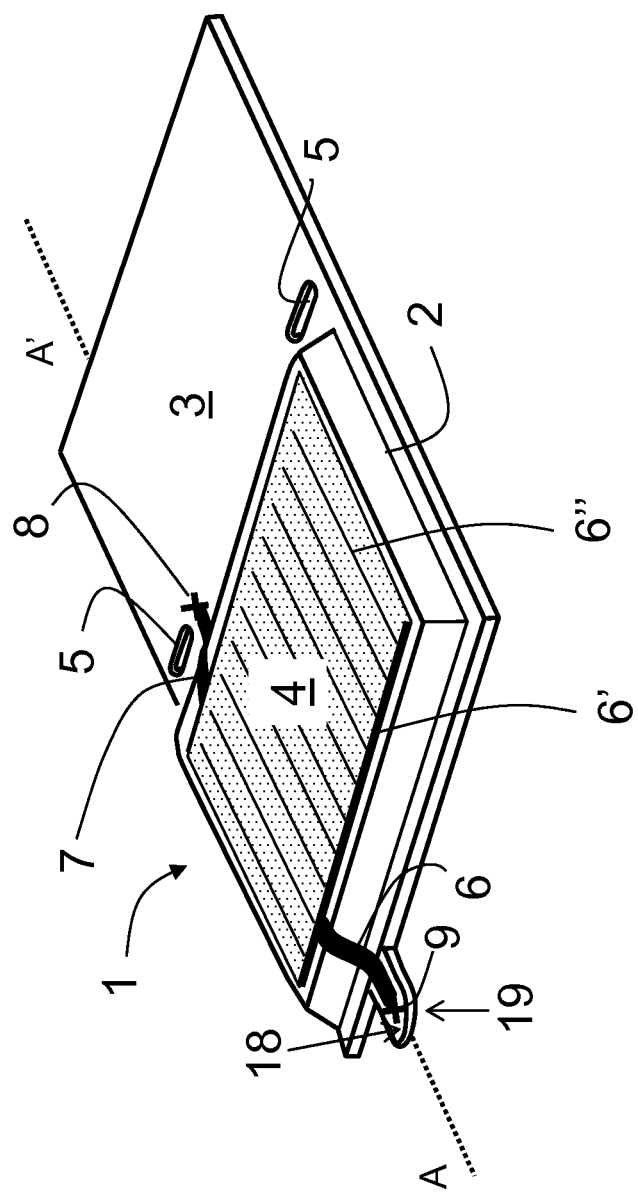
FIG. 1 illustrates a first embodiment of a covering element according to the invention.

FIG. 1 depicts a perspective view of an element that may be suited to producing a roof covering according to the invention. The element is, for example, a tile 1. This tile 1 for aesthetic reasons has a slight discontinuity or curvature 2 on its upper face, in the part intended to be exposed to the outside within the collection of tiles. A flatter tile could, however, be entirely suited to implementing the present invention, but its shape must not impede the rotating of the tile relative to the mobile tongue 9. Its thickness is preferably enough to leave the space required for electrical connection, for example to house the press stud according to the embodiment illustrated in FIG. 3, if need be. As shown in FIG. 1, tongue 9 has a first surface 18 which faces away from the roof when the tongue is in an unfolded position, and a second surface 19 which faces toward the roof when the tongue is in an unfolded position.

For example, a semi-rigid base tile suited to the implementation of the present invention can be manufactured using a method of molding and cutting as described in US 2006/0029775.

The other part 3 of the tile which, for example in the figure, represents approximately half of the total surface area of the tile, is flat and is intended to be covered by the curved parts 2 of the adjacent tiles after the covering has been installed, using techniques that are well known. The tile 1 also comprises, in the conventional way, regions 5 for securing the tiles, for example using nails or clips, onto the battens and/or onto a lathwork and/or onto a customary roofing panel that forms a continuous support and is also known by the American English terms of "roof deck" or "roof sheets".

The tile according to the invention is thus of conventional shape entirely analogous with the tiles conventionally used in the field of roof coverings.

It differs from such tiles, however, by the presence of a photovoltaic module 4 in the form of a layer covering substantially the entire curved part 2 that is intended to be exposed to the outside within the collection of tiles. According to well-known techniques, the photovoltaic module 4 is capable of collecting and converting light energy, particularly the solar radiation incident on the roof, into electrical energy used typically to power a domestic electrical installation with which the home is equipped.

Known electrical conduction means 6, 7, positioned in each side of the photovoltaic layer 4, are able, using known techniques, to collect the electrical current produced. These means are, for example, collecting strips or tapes 6, 7 formed of thin electrical conductors, preferably metal ones. These tapes extend beyond the curved region 2 and are in electrical contact with electric connectors 8 and 9 capable in particular of making an electrical connection with the previous and next tiles in the collection, of the series and/or parallel type, and ultimately with the electrical installation that is to be powered. Typically, and as is known, each of the ends of the collection of tiles mounted in series and/or in parallel is, for example, connected by busbars, also known in English as "electrical conductive buses", to a current converter typically used to power a domestic electrical installation. The number of tiles contained in a collection and the way in which they are connected either in parallel or in series are generally specified according to the current intensity and the potential difference best suited to the operation of the installation. An operating diagram of a collection such as this is described for example in U.S. Pat. No. 5,590,495, FIG. 10 and in the associated text, to which reference may for example be made for further details. In the embodiment illustrated by FIG. 1, the collecting tape 7 is connected to a first fixed connector 8 of known technology which is positioned on the part 3 of the tile 1. The part 3 is, for example, located near the top of the tile with respect to the region 2. The collecting tape 6 is connected to a second connector which is in the form of a foldable tongue 9, positioned in the lower part of the tile 1, in the continuation of the curved region 2.

Figure 2:
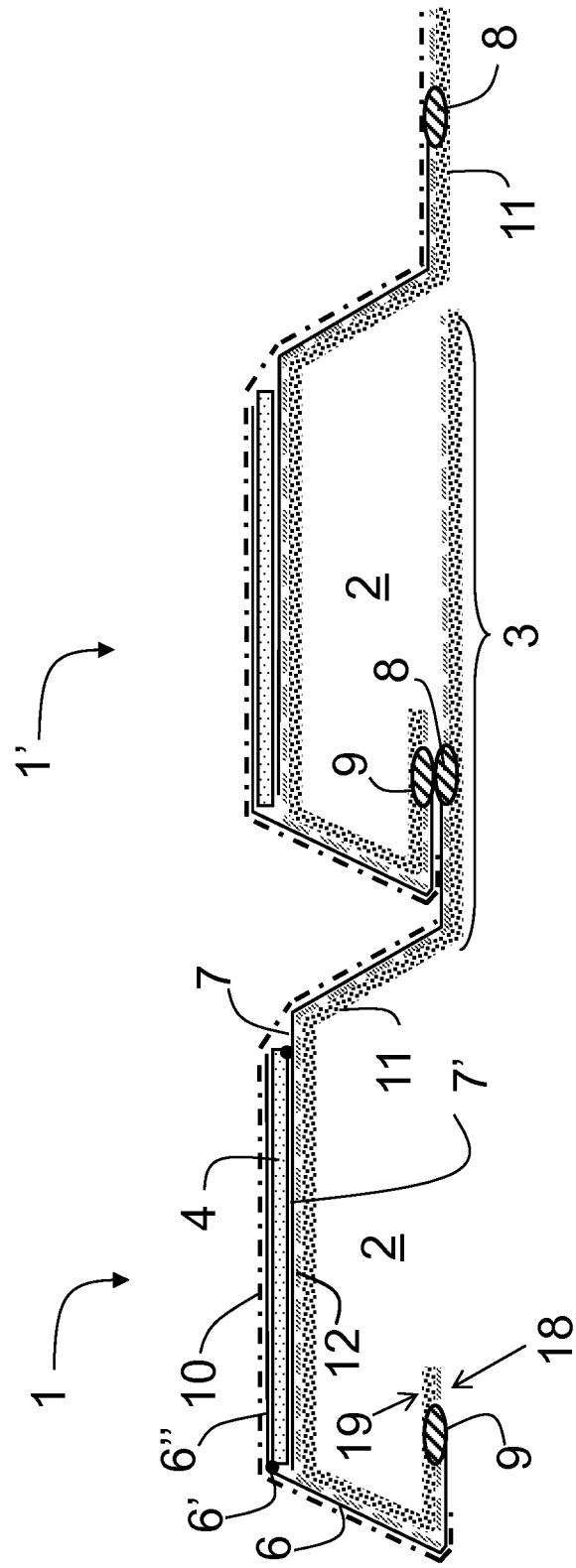
FIG. 2 is a schematic view in section on A-A' of the element of the figure and illustrates the collection of elements of the first embodiment in the covering.

FIG. 2 shows a view in section on A-A' of the tile of FIG. 1, schematically disclosing its various components. The figure also depicts a schematic view of how the tile 1 is connected to the next tile 1' in the collection. As shown in FIG. 2, the first surface 18 of tongue 9 faces toward the roof when the tongue is in a folded-over position, and the second surface 19 of the tongue 9 faces away from the roof when the tongue is in a folded-over position.

The tile 1 comprises a first layer of a backing material 11 which may be rigid, semi-rigid or flexible. According to the invention, all the base materials currently in use for roof coverings can be used, and among these, mention should particularly be made of materials of an inorganic nature such as cement, clay, metals. Mention may also be made of asphalt derivatives or other materials of an organic nature based on polymer or copolymer compounds or blends including polymers, thermoplastic polymers and thermosetting polymers such as aliphatic polymers, polyurethanes, polyacrylates, polyvinyls, possibly filled with mineral compounds, in the form of dense materials or in the form of foam or microcellular materials.

More specifically, by way of possible polymer materials, particular mention may be made of materials or blends of materials from the following list: polyvinyl chloride (PVC); polyethylene (PE); polypropylene (PP); polybutene (PB); polymethylpentene; polyacrylates; polyethyleneterephthalate (PET); polybutyleneterephthalate (PBT); polyethylenenaphthalate; ethylene-propylene-diene monomer copolymer and the copolymers and/or binary blends of such compounds.

By way of possible materials, mention may also be made of the following polymers, copolymers and blends:
ABS (an acrylonitrile butadiene styrene copolymer), ABS/PVC, ABS/PBT, ASA (acrylonitrile styrene acrylate), ASA/AES (a blend of ASA with acrylonitrile ethylene-propylene-styrene), ASA/PVC, acrylic/PVC, TPO (thermoplastic olefin), PC (polycarbonate), PPO (polyphenylene oxide) PC/PPO, nylon/PP, PP/PE, PP/PS (a blend of PP with polystyrene), CPVC (chlorinated polyvinyl chloride), and PVC/PU (a blend of PVC with polyurethane), said materials possibly containing inorganic fillers or flame retardants, aliphatic polyurethanes and thermoplastic elastomers.

Without this being compulsory for implementing the invention, the base material is preferably covered by an interlayer film 12 that typically forms a damp-proof layer and provides electrical insulation. An interlayer film 12 such as this is of use for example if the backing support has a certain degree of electrical conductivity and/or if it is porous.

The tile 1 is also equipped according to the invention with a photovoltaic module in the form of a layer 4. The photovoltaic layer is covered with a film 10 comprising a sheet of glass and/or preferably of transparent polymer, for example a flexible damp-proof and electrically insulating film like the one described for example in U.S. Pat. No. 5,986,203, in U.S. Pat. No. 5,741,370 or alternatively U.S. Pat. No. 5,990,414 or US 2005/0178429. The interlayer film 12, and the film 10, may be adhesive. For example, the film 12 may be adhesive on its top face in order to stick to the film 10 in the peripheral region surrounding the layer 4 and to the collector 7 in electrical contact with the lower region of the layer 4. The film 10 may likewise be adhesive on its underside. Without departing from the scope of the invention, the tile may either be equipped with a single photovoltaic module, but it may equally have several of these, these modules being connected to one another for example via conductors, preferably flat metallic conductors, on the curved face 2. Main collectors 6 and 7 formed of electrically conducting materials, preferably in the form of metal tapes, as previously indicated provide the electrical connection between the module and the respective connectors 9 and 8 present on the tile 1.

Connectors 9 and 8 and the main collectors 6 and 7 according to the invention may employ any technology known in the art.

As depicted in FIGS. 1 and 2, the collector 7', in electrical contact with the main collector 7, may for example have the form of a metal film or foil with the same surface area as the layer 4 in electrical contact with the underside thereof.

The collectors may for example be in the form of conducting wires 6", for example metal wires, running parallel along the upper face of the layer 4 and in electrical contact with, for example, a collecting tape 6' in electrical contact with the main collector 6.

According to the invention and without implying that this is restricted only to the embodiment illustrated in FIGS. 1 and 2, the electrical and mechanical connection between two connectors and two successive elements of the present photovoltaic collection may be achieved by any known fixing means. In particular, such means may be chosen from conductive adhesives, possibly thermally activated ones, hot or cold soldering, or even metal pads commonly known by their English name "steel wool-like pads" and, more generally, using any known pressure-sensitive fixing system. Without departing from the scope of the present invention, customary mechanical fixing means such as nails, staples, screws or rivets may also be used according to the invention.

One example of a particular method of connection of the present invention for connecting two connectors is described in the remainder of the description, in conjunction with FIG. 3.

FIG. 2 also schematically shows the layout of two successive adjacent tiles according to the invention. FIG. 2 shows that, within the collection that makes up the covering, the tongue 9 of the element 1' is positioned in contact with the fixed connector 8 of the tile 1. Further, the tongue 9 is kept in a folded-over position because it is sandwiched between the curved part 2 of the element 1' and the part 3 of the element 1. This configuration according to the invention has the decisive advantage over the devices described in the prior art of guaranteeing excellent watertightness of the electrical connection made between the two tiles over time, said connection being protected not only by the curved part 2 of the tile 1' but also, because it is kept in the folded-over position between the two tiles, by the successive layers of material of which the tongue 9 is made.

According to one particular embodiment of the invention which is even better at avoiding the ingress of water into the contact region 9, it is possible to add an additional tongue to prevent rainwater from condensing in the region between the two tiles 1 and 1'.

Figure 2A:
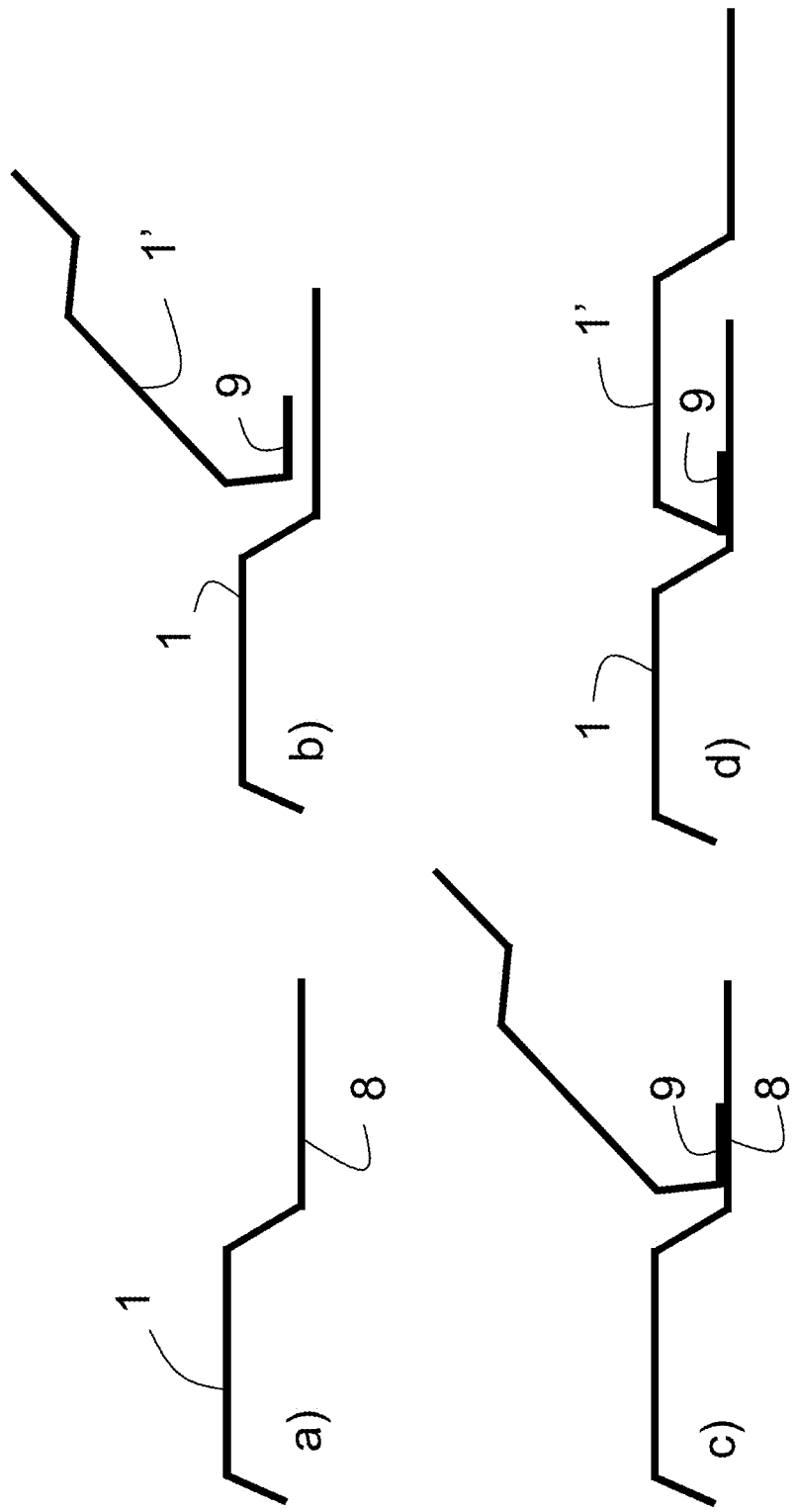
FIG. 2a illustrates the method of assembly used for fastening and connecting two successive elements of the collection.

FIG. 2a shows how simple it is to lay the tiles described using FIG. 2.

In a first step a) a first tile 1, equipped with a connector 8, is fixed to the framework or lathwork (not depicted), particularly using a fixing system at the regions 5 (which are not depicted in FIG. 2). In a second step b), the second tile 1' is offered up to the previous one, the tongue 9 still being in a substantially open position. In a step c) the second tile 1' is brought into contact with the first one 1, the connectors 8 and 9 being offered up to one another. The installer then checks for correct electrical connection, the tongue 9 being kept in the open position, with the tile 1' not yet fully folded down, then the two connectors are fixed together. Finally, in step d), the second tile 1' is brought into its definitive position on top of the first tile 1 and the tongue 9 is then folded over and sandwiched between the two tiles 1, 1', thus affording optimal effective electrical contact between the two connectors 8, 9. The installer can then permanently attach the second tile to the framework. The foregoing description thus reveals a further advantage of the present invention, namely the ease of implementation, which is very close to the conventional techniques employed by roofers using non-solar covering, unlike the solutions described previously.

In order further to improve the watertightness, the installer may also, for example, spray polyurethane foam before folding the tile 1' down as described in step d).

FIG. 3 more specifically describes a system for effecting electrical contact between two connectors different from those already known, such as for example those described in application U.S. Pat. No. 5,590,495, although these could equally well be used in the context of the present invention. According to this particular embodiment of the invention, the connection between two successive elements in the collection is achieved by way of a device of the press stud type. This device is made up of two parts, one comprising a male part 31 of the press stud, the other comprising a female part 32 of the press stud. As may be seen in FIG. 3, the male part 31 of the device forms part of a first fixed connector of the first element 1 and the female part 32 of the device forms part of the foldable tongue of the second element 1'.

The female part 32 may advantageously further comprise a press ring 33, in a similar way to the press studs conventionally used, for example, in the field of haberdashery. The female part fully or partially consists of metallic elements, so as to provide the electrical connection between the electrically conducting tape 6 and the press ring 33. Said connection may advantageously be reinforced with soldering. The male part is designed in the same way but is connected to the electrically conducting tape 7. According to one possible embodiment that guarantees perfect watertightness over time, the female part 32 may be covered on its upper face with a plastic film or cap 34 and on its underside with a film 36, both of which are electrically insulating and damp-proof. Provision may also be made for the film 34 to extend around the periphery of the tongue of the tile 1' and for it to have adhesive properties so as to cover part of the tile 1 and thus provide even more superior watertightness over time. Likewise, the male part 31 may be insulated and protected on its top face by a film or cap 35 of the same kind. When the roofing elements are being laid and interconnected, a product of the hydrophobic type or a resin or, for example, polyurethane foam, may be sprayed onto the top side of the female part to provide additional watertightness.

FIGS. 4 and 5 show a type of collection with an alternative embodiment of a covering according to the invention. According to this embodiment, the covering is obtained by arranging tiles according to the invention in a staggered configuration in a horizontal direction.

According to this embodiment, two types of tile are needed, the first type of tile 41 for covering the lower row L and a second type of tile 42 for covering the upper row U, as is depicted in FIG. 4.

With reference to FIG. 5*a*, the first type of tile 41 comprises two fixed connectors 8, 8' positioned substantially at the same height on the element, near the flat part 3 and above the curved part 2 that is covered with the photovoltaic layer 4.

With reference to FIG. 5*b*, the second type of element comprises two connectors 9, 9' in the form of foldable moving tongues according to the invention. These connectors 9, 9' are positioned at the bottom end of the tile 42, under the curved part 2.

In the collection, the two types of element are positioned in such a way that a fixed connector of an element of the first type is in electrical contact with a tongue of an element of the second type. A connection such as this is illustrated in FIG. 5*c*. In a similar way to the previous embodiments, FIG. 5*c* shows that once positioned in the collection, the tongue 9 is kept in a folded-over position and is sandwiched between the curved part 2 of the element 42 and the flat part 3 of the element 41, thus guaranteeing perfect water-tightness, over time, of the electrical connection made between the two tiles by means of the connectors 8 and 9'.

In one possible embodiment, the tiles 41 and 42 are assembled into a collection and connected by means of the device of the press-stud type described previously in conjunction with FIG. 3. The tiles 41 of the row L have two connection regions equipped with fixed connectors 8 and 8'. The connectors 8 and 8' each comprise a male connecting part as previously described. The collector positioned above the photovoltaic layer 4 of the tiles 41 is in electrical contact with the first male plug 8 of said tiles 41. The collecting tape positioned below the photovoltaic layer 4 of the tiles 41 is in electrical contact with the second male plug 8' of said tiles 41.

The tiles 42 of the row U have two connection regions equipped with connectors in the form of foldable tongues 9 and 9'. The connectors 9 and 9' each comprise a female connecting part as previously described.

The collector positioned above the photovoltaic layer 4 of the tiles 42 is in electrical contact with the first female socket 9 of said tiles 42. The collector positioned below the photovoltaic layer 4 of the tiles 42 is in electrical contact with the second male plug 9' of said tiles 42.

Electrical connection is made by attaching the tongue of the element 42 to the element 41, said tongue being sandwiched and held in a folded-over position between these two elements. The elements are typically laid using the same steps as those described in conjunction with FIG. 2*a*.

This assembly into a collection therefore leads to a series connection between two adjacent tiles of two different rows. The staggered configuration finally obtained for the collection of tiles 41 and 42 in the rows U and L, thus series connected to form a photovoltaic line, is depicted schematically in FIG. 4.

FIGS. 5*d* and 5*e* show examples of half-tiles with the special design 421 and 411 that can be used to complete the horizontal rows U and L respectively. These half-tiles bear connectors suited to the tiles U and L, for example of the press-stud type. Attached to these connectors is an outlet cable bearing a conventional electrical plug or socket connector E1 or E2. This plug or socket connector will connect to an electric cable connected via a converter or an inverter to the electrical network of the installation. This electrical cable may run through a grommet for example positioned under the roof overhang, on each gable. This grommet could contain the cables from several "photovoltaic lines". The roofer will thus be able to lay a horizontal row of tiles 41 and of tiles 42, connecting them one by one, in the way illustrated by FIG. 4.

FIG. 6 shows a tile according to another embodiment of the invention, comprising a foldable tongue 9 positioned on the side of the tile 61 near the bottom region 2 comprising the photovoltaic layer 4. This tongue has, for example, a female part as previously described for the electrical connection between two adjacent tiles 61 and 61'. On the other side of the tile, at the same level, there is a tongue 60, preferably a fixed tongue, comprising a male connecting part.

The assembly into a collection and the connection between two successive tiles are illustrated by FIG. 6 and these acts are performed for example according to the method described in conjunction with FIG. 2*a*.

As illustrated by FIG. 6, this embodiment has the advantage of allowing a series connection to be made on just one row or on a portion of just one row. A configuration such as this makes it possible in particular, by comparison with the method illustrated in FIG. 5, to reduce, for the same length of roof, the potential differences inherent in a series setup.

FIG. 7 corresponds to another embodiment similar to the one described in conjunction with FIG. 6, in which the point of attachment this time is located under the region of overlap, near to the photovoltaic layer 4.

Obviously, the present invention is not restricted to the embodiments previously described. More specifically, any other possible way of assembling roof covering elements into collections that correspond in particular to roofing patterns known in the art, and in which the connections between elements equipped with photovoltaic modules are made in series setups, parallel setups or in setups comprising both series or parallel connections must be understood to be included within the scope of the present invention.

The invention claimed is:

1. A photovoltaic roof covering comprising a collection of a plurality of elements in the form of tiles, shingles or panels, disposed on a roof and electrically connected to one another, each of said elements of the plurality of elements comprising:
   a backing material comprising an interior face facing toward the roof and an exterior face facing away from the roof,
   a photovoltaic layer arranged at least over that portion of the exterior face of the backing material that is exposed to an outside environment in the collection,
   a foldable moving tongue or strip connected to the backing material and having a first surface and a second surface opposing the first surface, the first surface facing away from the roof when in an unfolded position, and the second surface facing toward the roof when in an unfolded position, and
   electrical conduction means positioned on each side of said photovoltaic layer and configured to collect electrical current generated by said photovoltaic layer when the photovoltaic layer is exposed to light, said electrical conduction means comprising a first connector connected to one electrical pole of the photovoltaic layer, the first connector being disposed at the first surface of the foldable moving tongue or strip, and a second connector connected to another electrical pole of the photovoltaic layer, the second connector is disposed at the exterior face of the backing material and faces away from the roof, wherein each of said elements of the plurality of elements overlies an underlying element, such that a part or portion of the underlying element is covered by said element, and a part or portion of the underlying element is exposed to the outside environment, each underlying element being another of the plurality of elements, or comprising a backing material comprising an interior face facing toward the roof and an exterior face facing away from the roof, a photovoltaic layer arranged at least over that portion of the exterior face of the backing material that is exposed to the outside environment in the collection, and electrical conduction means positioned on each side of said photovoltaic layer and configured to collect the electrical current generated by said photovoltaic layer when the photovoltaic layer is exposed to light, said electrical conduction means comprising a first connector connected to one electrical pole of the photovoltaic layer, and a second connector connected to another electrical pole of the photovoltaic layer, the second connector is disposed at the exterior face of the backing material and faces away from the roof;

and wherein for each of said elements of the plurality of elements as arranged in the collection, the foldable moving tongue or strip is disposed in a position that is folded over between said element and the underlying element, such that the first surface of the foldable moving tongue or strip of said element faces toward the roof, the first connector of said element faces toward the roof and is in electrical contact with the second connector of the underlying element, the second surface of the foldable moving tongue or strip of said element faces away from the roof, and the second connector of the underlying element facing away from the roof.

2. The photovoltaic roof covering according to claim 1, wherein each of said elements of the plurality of elements has a down-roof end and an up-roof end, and wherein in each of said elements of the plurality of elements, the first connector and the foldable moving tongue or strip are disposed at the down-roof end of said element, and the second connector is disposed on the backing material up-roof from the photovoltaic layer.

3. The photovoltaic roof covering as claimed in claim 1, wherein for each of said elements of the plurality of elements, the part of said element that is exposed to the outside environment in the collection has an outwardly curved shape.

4. The photovoltaic roof covering as claimed in claim 1, in which said plurality of elements are electrically interconnected in series, in parallel, or in a combination of series and parallel, the collection of the plurality of elements having a plurality of ends, each of the ends of said collection being electrically connected by busbars to a current converter.

5. The photovoltaic roof covering as claimed in claim 1, in which in each of said elements of the plurality of elements, the backing material is rigid and formed from clay, and in which the tongue or the strip is made of or comprises an identical or different rigid material, the connection of the tongue or strip to the backing material and the mobility of the tongue being afforded by a hinge, by one or more films, or by a combination thereof.

6. The photovoltaic roof covering as claimed in claim 1, in which in each of said elements of the plurality of elements, the backing material comprises a flexible or semi-rigid material, and wherein the tongue or strip is made from the flexible or semi-rigid material, the deformation of which allows said tongue or said strip to be brought into the folded-over position.

7. The photovoltaic roof covering as claimed in claim 1, in which for each of said elements of the plurality of elements, the second connector of the underlying element is positioned on that part or portion of the underlying element that is covered by said element.

8. The photovoltaic roof covering as claimed in claim 1, in which for each of said elements of the plurality of elements, the second connector of the underlying element is disposed facing up on a non-removable tongue or strip positioned on one side of the underlying element.

9. The photovoltaic roof covering as claimed in claim 1, wherein for each of said elements of the plurality of elements, the first connector of said element is mechanically connected to the second connector of the underlying element, and in which the electrical and mechanical connection between the first connector of said element and the second connector of the underlying element is performed using fixing means selected from conductive adhesives, cold or hot solder, metallic pads, pressure-sensitive fixing systems, and mechanical fixing elements.

10. The photovoltaic roof covering as claimed in claim 9, wherein for each of said elements of the plurality of elements, the electrical and mechanical connection between is performed using a press-stud device comprising a male part and a female part, one of which forms part of the first connector of said element and the other of which forms part of the second connector of the underlying element.

11. The photovoltaic roof covering as claimed in claim 10, in which for each of said elements of the plurality of elements, the male and female parts of the first connector of said element and of the second connector of the underlying element are covered with one or more electrically insulating damp-proof films or covers.

\* \* \* \* \*

UNITED STATES PATENT AND TRADEMARK OFFICE
CERTIFICATE OF CORRECTION

PATENT NO. : 8,671,630 B2  Page 1 of 1
APPLICATION NO. : 12/594925
DATED : March 18, 2014
INVENTOR(S) : Lena et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 768 days.

Signed and Sealed this

Twenty-ninth Day of September, 2015

Michelle K. Lee
*Director of the United States Patent and Trademark Office*